(12) United States Patent
Cheng et al.

(10) Patent No.: US 10,592,033 B2
(45) Date of Patent: Mar. 17, 2020

(54) PRESSURE SENSOR, TOUCH SUBSTRATE AND TOUCH DISPLAY DEVICE

(71) Applicant: BOE TECHNOLOGY GROUP CO., LTD., Beijing (CN)

(72) Inventors: Hongfei Cheng, Beijing (CN); Yuxin Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 65 days.

(21) Appl. No.: 15/552,370

(22) PCT Filed: Feb. 24, 2017

(86) PCT No.: PCT/CN2017/074753
§ 371 (c)(1),
(2) Date: Aug. 21, 2017

(87) PCT Pub. No.: WO2017/206559
PCT Pub. Date: Dec. 7, 2017

(65) Prior Publication Data
US 2018/0188873 A1    Jul. 5, 2018

(30) Foreign Application Priority Data
Jun. 3, 2016    (CN) .......................... 2016 1 0390259

(51) Int. Cl.
*G06F 3/041* (2006.01)
*G01L 9/00* (2006.01)
(Continued)

(52) U.S. Cl.
CPC .......... *G06F 3/0414* (2013.01); *G01L 9/0051* (2013.01); *G01L 9/0072* (2013.01);
(Continued)

(58) Field of Classification Search
CPC ........... H01L 29/42384; H01L 29/4908; H01L 27/1214; G02F 1/13338; G06F 3/0412; G06F 3/0414
See application file for complete search history.

(56) References Cited

U.S. PATENT DOCUMENTS

2006/0077186 A1* 4/2006 Park ....................... G06F 3/0412
345/173
2009/0141004 A1* 6/2009 Yamazaki ............. G06F 3/0412
345/175
(Continued)

FOREIGN PATENT DOCUMENTS

| CN | 102856355 A | 1/2013 |
| CN | 103294317 A | 9/2013 |

(Continued)

OTHER PUBLICATIONS

Search Report and Written Opinion dated May 25, 2017 from State Intellectual Property Office of the P.R. China.
Chinese Office Action dated Aug. 11, 2017.

*Primary Examiner* — Sepehr Azari
(74) *Attorney, Agent, or Firm* — Dilworth & Barrese, LLP.; Michael J. Musella, Esq.

(57) ABSTRACT

A pressure sensor, a touch substrate and a touch display device are provided. The pressure sensor includes: an active layer; a gate electrode, which is stacked with the active layer and insulated from the active layer; an elastic layer, which is arranged between the active layer and the gate electrode in a direction perpendicular to the active layer, and a thickness of the elastic layer is decreased in a case that a pressure is applied to the pressure sensor; and a source electrode and a drain electrode, which are spaced from each other and are both electrically connected with the active layer.

18 Claims, 4 Drawing Sheets

(51) Int. Cl.
*G06F 3/047* (2006.01)
*G01L 5/00* (2006.01)

(52) U.S. Cl.
CPC .............. *G06F 3/041* (2013.01); *G06F 3/047* (2013.01); *G06F 2203/04103* (2013.01)

(56) References Cited

U.S. PATENT DOCUMENTS

| | | | |
|---|---|---|---|
| 2009/0199648 A1* | 8/2009 | Sung | G01L 9/0098 73/754 |
| 2013/0001556 A1 | 1/2013 | Hu et al. | |
| 2013/0050126 A1* | 2/2013 | Kimura | G02F 1/13338 345/173 |
| 2014/0096622 A1 | 4/2014 | Kawate | |
| 2015/0145812 A1 | 5/2015 | Sun et al. | |

FOREIGN PATENT DOCUMENTS

| | | |
|---|---|---|
| CN | 103608824 A | 2/2014 |
| CN | 105353903 A | 2/2016 |
| CN | 106066224 A | 11/2016 |
| JP | 2014228454 A | 12/2014 |

* cited by examiner

PRESSURE SENSOR, TOUCH SUBSTRATE AND TOUCH DISPLAY DEVICE

TECHNICAL FIELD

Embodiments of the present disclosure relate to a pressure sensor, a touch substrate and a touch display device.

BACKGROUND

An in cell touch display device and an on cell touch display device are two common touch display devices. A touch sensor structure of the in cell touch display device is arranged within a display panel, and a touch sensor structure of the on cell touch display device is arranged outside the display panel and arranged on a substrate which the display panel comprises.

Currently, a touch sensor structure in the touch display device is obtained by forming one or two conductive thin films on the substrate and performing patterning processing on the one or two conductive thin films.

SUMMARY

According to embodiments of the disclosure, a pressure sensor, a touch substrate and a touch display device are provided.

According to the embodiments of the disclosure, a pressure sensor is provided. The pressure sensor comprises: an active layer; a gate electrode, which is stacked with the active layer and insulated from the active layer; an elastic layer, which is arranged between the active layer and the gate electrode in a direction perpendicular to the active layer; and a source electrode and a drain electrode, which are spaced from each other and are both electrically connected with the active layer, wherein, in a case that a pressure is applied to the pressure sensor, a thickness of the elastic layer is decreased.

For example, at a position where the pressure is applied to the pressure sensor, the thickness of the elastic layer is decreased by at least about 5%.

For example, the thickness of the elastic layer is about 0.5 micron to 5 microns in a case that the pressure is not applied to the pressure sensor.

For example, a Young's modulus of the elastic layer is about 0.1 MPa to 10 MPa.

For example, a material for forming the elastic layer includes at least one or more of rubber, polyurethane, polypropylene, and polyformaldehyde.

For example, an orthogonal projection of the gate electrode on the elastic layer is substantially located within the elastic layer.

For example, an orthogonal projection of the active layer on the elastic layer is substantially located within the elastic layer.

For example, in the direction perpendicular to the active layer, an interlayer insulating layer is arranged between the elastic layer and at least one of the gate electrode and the active layer.

For example, the pressure sensor further comprises a substrate on which the active layer, the elastic layer, the gate electrode, the source electrode and the drain electrode are formed, wherein, the elastic layer is arranged on a side of the active layer away from the substrate.

According to the embodiments of the disclosure, the touch substrate is provided. The touch substrate comprises: a base substrate; a plurality of pressure sensors as described above, which are arranged on the base substrate; a plurality of first signal lines spaced from each other, which are arranged on the base substrate and are electrically connected with gate electrodes of the plurality of pressure sensors respectively; a plurality of second signal lines spaced from each other, which are arranged on the base substrate, intersect with the plurality of first signal lines respectively, and are electrically connected with source electrodes of the plurality of pressure sensors respectively; and a plurality of third signal lines spaced from each other, which are arranged on the base substrate, are insulated from the first signal lines and the second signal lines, and are electrically connected with drain electrodes of the plurality of pressure sensors respectively.

For example, the plurality of third signal lines are parallel with the plurality of second signal lines.

For example, in a direction perpendicular to the base substrate, the elastic layer of each pressure sensor overlaps with at least one of the second signal line adjacent to the pressure sensor and the third signal line adjacent to the pressure sensor.

According to the embodiments of the disclosure, the touch display device is provided. The touch display device comprises the touch substrate as described above.

For example, the touch display device further comprises a plurality of pixel units and a plurality of transistors, wherein the plurality of transistors are respectively connected with the plurality of pixel units.

For example, the touch display device further comprises: a plurality of data lines spaced from each other, which are arranged on the base substrate which the touch substrate comprises, and are insulated from the first signal lines, the second signal lines and the third signal lines, wherein, source electrodes of the plurality of transistors are respectively connected with the data lines, and gate electrodes of the plurality of transistors are respectively connected with the first signal lines.

For example, the touch display device further comprises: a plurality of gate lines spaced from each other, which are arranged on the base substrate which the touch substrate comprises, and are insulated from the first signal lines, the second signal lines and the third signal lines, wherein, gate electrodes of the plurality of transistors are respectively connected with the gate lines, and source electrodes of the plurality of transistors are respectively connected with the second signal lines.

For example, the touch display device further comprises: a plurality of data lines spaced from each other and a plurality of gate lines spaced from each other, wherein, the date lines and the gate lines are both arranged on the base substrate which the touch substrate comprises, and are insulated from the first signal lines, the second signal lines and the third signal lines, gate electrodes of the plurality of transistors are respectively connected with the gate lines, and source electrodes of the plurality of transistors are respectively connected with the data lines.

For example, the touch display device further comprises: a flexible substrate arranged opposite to the base substrate which the touch substrate comprises, wherein, the pressure sensors which the touch substrate comprises are arranged between the base substrate and the flexible substrate.

For example, the touch display device further comprises a display panel, wherein, the display panel includes a first substrate and a second substrate which are arranged opposite to each other, and the pressure sensors which the touch substrate comprises are arranged on a side of the first substrate away from the second substrate.

According to the embodiments of the disclosure, the pressure sensor, the touch substrate and the touch display device are provided. In the embodiments of the disclosure, the pressure elastic layer is arranged between the gate electrode and the active layer of the thin film transistor so as to form the pressure sensor, the thickness of the pressure elastic layer is decreased when the thin film transistor is touched, and therefore the change of the pressure signal can be converted into the change of the output signal of the thin film transistor, and by detecting the output signal of the thin film transistor, the amplitude of the touch pressure and/or the touch position can be determined.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1:
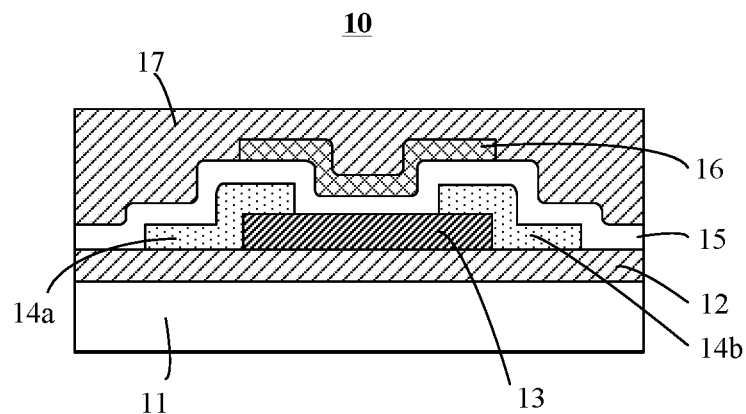
FIG. 1 is a sectional view of a pressure sensor provided by embodiments of the present disclosure.

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise defined, the technical terms or scientific terms here should be of general meaning as understood by those ordinarily skilled in the art. In the descriptions and claims of the present disclosure, expressions such as "first", "second" and the like do not denote any order, quantity, or importance, but rather are used for distinguishing different components. Expressions such as "include" or "comprise" and the like denote that elements or objects appearing before the words of "include" or "comprise" cover the elements or the objects enumerated after the words of "include" or "comprise" or equivalents thereof, not exclusive of other elements or objects. Expressions such as "connect" or "interconnect" and the like are not limited to physical or mechanical connections, but may include electrical connections, whether direct or indirect. Expressions such as "up", "down", "left", "right" and the like are only used for expressing relative positional relationship, the relative positional relationship may be correspondingly changed in the case that the absolute position of a described object is changed.

Embodiments of the present disclosure provide a pressure sensor, a touch substrate and a touch display device. In the embodiments of the present disclosure, a pressure elastic layer is arranged between a gate electrode and an active layer of a thin film transistor so as to form a pressure sensor, a thickness of the pressure elastic layer is decreased when the thin film transistor is touched, and therefore a change of a pressure signal can be converted into a change of an output signal of the thin film transistor, and by detecting the output signal of the thin film transistor, an amplitude of a touch pressure and/or a touch position can be determined.

Hereinafter, the pressure sensor, the touch substrate and the touch display device provided by the embodiments of the present disclosure will be described in detail in combination with the drawings. Thicknesses and shapes of various thin films in the drawings do not reflect a real proportion, and only schematically describe the contents of the embodiments of the present disclosure.

As shown in FIG. 1, at least one embodiment of the present disclosure provides a pressure sensor 10 (for example, which is a thin film transistor), and the pressure sensor 10 comprises an active layer 13, a source electrode 14a, a drain electrode 14b, an elastic layer 15 and a gate electrode 16. The source electrode 14a and the drain electrode 14b are spaced from each other and are both electrically connected with the active layer 13. The gate electrode 16 is stacked with the active layer 13 and is insulated from the active layer 13. The elastic layer 15 is arranged between the active layer 13 and the gate electrode 16 in a direction perpendicular to the active layer 13, and for example, the elastic layer 15 is an elastic insulating layer so that the gate electrode 16 and the active layer 13 insulate from each other by the elastic layer 15; and the elastic layer 15 is configured to deform in a case that a pressure is applied to the pressure sensor 10, that is to say, a thickness of the elastic layer 15 is decreased at a position where the pressure is applied to the pressure sensor 10, and therefore according to a thickness decrease amount of the elastic layer 15, whether the pressure is applied to the pressure sensor 10 or not and an amplitude of the applied pressure are determined.

For example, the pressure sensor 10 further comprises a substrate 11 on which the active layer 13, the elastic layer 15, the gate electrode 16, the source electrode 14a and the drain electrode 14b are formed, and the elastic layer 15 is arranged on a side of the active layer 13 away from the substrate 11 (as shown in FIG. 1, the elastic layer 15 is arranged on an upper side of the active layer 13). In this way, in a case that the pressure is applied to the pressure sensor 10 from a side (as shown in FIG. 1, an upper side of the substrate 11) of the substrate 11 provided with the above structure, the elastic layer 15 is closer to a force applying object (such as a finger), so that the force applying object presses the elastic layer 15 deform more easily.

In a case that the elastic layer 15 is arranged on the side of the active layer 13 away from the substrate 11, the pressure sensor 10 is of a top gate structure, that is to say, the gate electrode 16 is arranged on the side of the active layer 13 away from the substrate 11. Of course, the pressure sensor 10 may adopt a bottom gate structure, that is to say, the gate electrode 16 is arranged between the active layer 13 and the substrate 11.

What needs to be explained is that, in a case that the pressure sensor 10 comprises the substrate 11, the direction perpendicular to the active layer 13 is a direction perpendicular to a main surface of the substrate 11. Of course, other structures may further be arranged on the substrate 11, for example, an insulating layer 12 located between the substrate 11 and the active layer 13 and/or an insulating layer 17 covering the gate electrode 16, the elastic layer 15 and the active layer 13 are arranged on the substrate 11.

In the embodiments of the present disclosure, in a case that the pressure is applied to the pressure sensor 10, the thickness of the elastic layer 15 is decreased, and therefore an output current (namely a current between the source electrode 14a and the drain electrode 14b) of the pressure sensor 10 is increased. For example, in order to guarantee that a change of the current between the source electrode and the drain electrode caused by deformation of the elastic layer 15 is reliably detected, at the position where the pressure is applied to the pressure sensor 10, a thickness change percentage of the elastic layer 15 is at least about 5%.

For example, an original thickness (a thickness in a case that the pressure is not applied to the pressure sensor 10) of the elastic layer 15 is d, and the current between the source electrode 14a and the drain electrode 14b is I in a case that the elastic layer 15 is at the original thickness. After the pressure is applied to the pressure sensor 10, the thickness of the elastic layer 15 is decreased by about 5%, and therefore the thickness of the elastic layer 15 is about (1−5%)d after the thickness is decreased; in this case, the current between the source electrode and the drain electrode is increased by about 5%, and for example, the current after being increased is about (1+5.263%)I. In a case that the current between the source electrode and the drain electrode is changed by at least about 5%, the change of the current can be reliably detected.

For example, the thickness of the elastic layer 15 is about 0.5 micron to 5 microns in the case that the pressure is not applied to the pressure sensor 10. Such thickness range is beneficial to detecting the change of the output signal of the pressure sensor 10. This is because: if the elastic layer 15 is too thick, it needs to apply a high voltage to the gate electrode 16; if the elastic layer 15 is too thin, deformation of the elastic layer 15 is not obvious.

For example, a Young's modulus of a material for forming the elastic layer 15 is about 0.1 MPa to 10 MPa. The Young's modulus is a physical parameter representing tensile resistance capacity or pressure resistance capacity of the material within an elastic limit. If the Young's modulus of the elastic layer 15 is lower than about 0.1 MPa, a great pressure is needed to make the elastic layer 15 deform; and if the Young's modulus is greater than about 10 MPa, the elastic layer 15 is too soft, which reduce durability of an electrode (such as the gate electrode 16) of the pressure sensor 10.

For example, the elastic layer 15 has a restore performance, and in a case that the external force applied to the pressure sensor 10 disappears, the elastic layer 15 automatically restores. For example, the elastic layer 15 is made from a macromolecular elastic material, and for example, the material for forming the elastic layer 15 includes at least one or more of rubber, polyurethane, polypropylene, and polyformaldehyde.

In the embodiments of the present disclosure, an area of the elastic layer 15 is not limited, and it is only needed that the elastic layer 15 is arranged between the gate electrode 16 and the active layer 13 and is used for reliably detecting the touch pressure.

For example, as shown in FIG. 1, an orthogonal projection of the gate electrode 16 on the elastic layer 15 is substantially located within the elastic layer 15. By arranging the elastic layer 15 larger, pressure borne by the gate electrode 16 is well transmitted to the elastic layer 15, thereby being beneficial to guaranteeing sensitiveness of the pressure sensor 10 to the external pressure.

Figure 2:
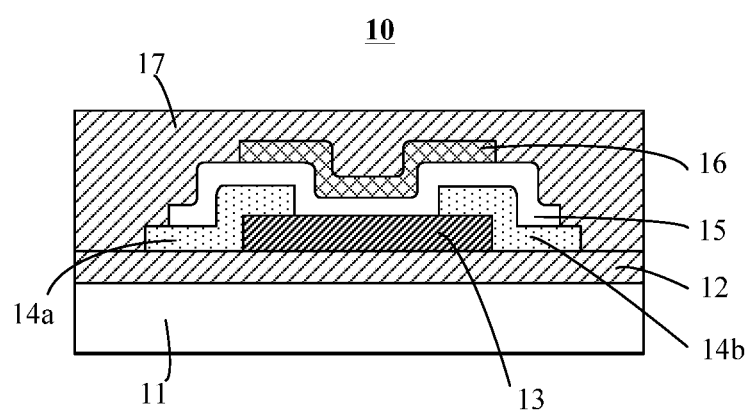
FIG. 2 is a sectional view of another pressure sensor provided by the embodiments of the present disclosure.

What needs to be explained is that, as shown in FIG. 1, the elastic layer 15 covers a whole of the source electrode 14a and the drain electrode 14b; or, as shown in FIG. 2, the elastic layer 15 covers a part of the source electrode 14a and the drain electrode 14b.

For example, as shown in FIG. 1 and FIG. 2, an orthogonal projection of the active layer 13 on the elastic layer 15 is substantially located within the elastic layer 15. In this way, it is beneficial to guarantee that the pressure applied on the active layer 13 is uniform, and therefore a possibility that the active layer 13 breaks is decreased.

Figure 3:
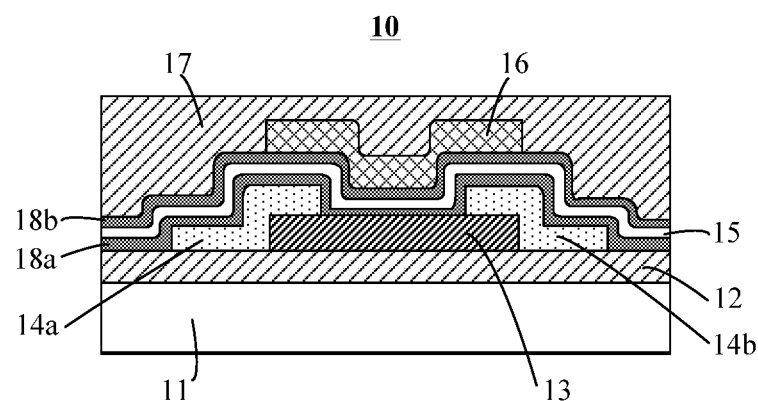
FIG. 3 is a sectional view of still another pressure sensor provided by the embodiments of the present disclosure.

For example, as shown in FIG. 3, in the direction perpendicular to the active layer 13, an interlayer insulating layer 18a is arranged between the elastic layer 15 and the active layer 13, and another interlayer insulating layer 18b is arranged between the elastic layer 15 and the gate electrode 16. Of course, it can be also that only one of the interlayer insulating layer 18a and the interlayer insulating layer 18b is arranged. By arranging the interlayer insulating layer between at least one of the active layer 13 and the gate electrode 16 and the elastic layer 15, it is beneficial to guarantee the performances of the pressure sensor 10. For example, in a case that a great deformation happens to the elastic layer 15 and consequently the elastic layer 15 becomes thinner, the interlayer insulating layer 18a and/or the interlayer insulating layer 18b can guarantee normal work of the pressure sensor 10.

In the embodiments of the present disclosure, the active layer 13 for example is made from amorphous silicon, polycrystalline silicon, metal oxide and other semiconductor materials frequently used in the field, the gate electrode 16, the source electrode 14a and the drain electrode 14b for example are made from aluminum, aluminum neodymium alloy, copper, titanium, molybdenum, molybdenum niobium alloy and other metal materials frequently used in the field, and the substrate 11 for example is a glass substrate, a quartz substrate or a plastic substrate or the like.

Figure 4A:
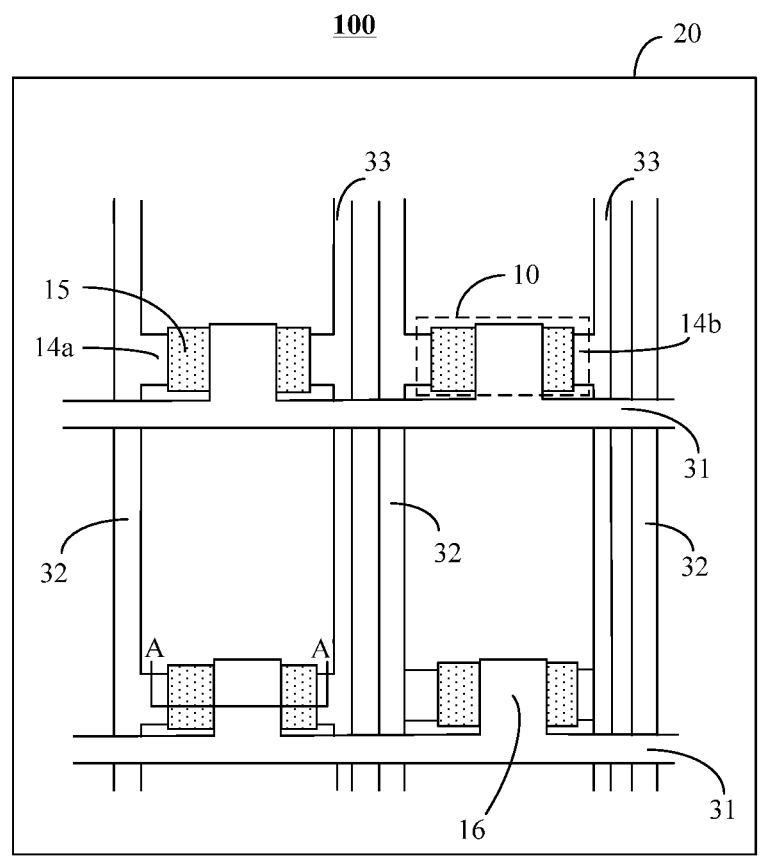
FIGS. 4a and 4b are respectively top views of a touch substrate provided by the embodiments of the present disclosure.

At least one embodiment of the present disclosure further provides a touch substrate 100, as shown in FIG. 4a, the touch substrate comprises a base substrate 20, a plurality of pressure sensors 10 provided by any one of the above embodiments, a plurality of first signal lines 31, a plurality of second signal lines 32 and a plurality of third signal lines 33. The plurality of pressure sensors 10 are arranged on the base substrate 10 (for example, as shown in FIG. 4a, the plurality of pressure sensors 10 are spaced from each other); the plurality of first signal lines 31 are arranged on the base substrate 20 and spaced from each other and are electrically connected with gate electrodes 16 of the plurality of pressure sensors 10 respectively (that is to say, each first signal line 31 and a gate electrode 16 of a corresponding pressure sensor 10 are electrically connected, and for example are integrally formed); the plurality of second signal lines 32 are arranged on the base substrate 20 and spaced from each other, intersect with the plurality of first signal lines 31 respectively (that is to say, an extension direction of the second signal lines 32 intersect with an extension direction of the first signal lines 31), and are electrically connected with source electrodes 14a of the plurality of pressure sensors 10 respectively (that is to say, each second signal line 32 and a source electrode 14a of the corresponding pressure sensor 10 are electrically connected, and for example are integrally formed); the plurality of third signal lines 33 are arranged on the base substrate 20 and spaced from each other, are insulated from the first signal lines 31 and the second signal lines 32, and are electrically connected with drain electrodes 14b of the plurality of pressure sensors 10 respectively (that is to say, each third signal line 33 and a drain electrode 14b of the corresponding pressure sensor 10 are electrically connected, and for example are integrally formed).

What needs to be explained is that, at a position where the first signal line 31 intersects with the second signal line 32, an insulating layer is arranged between the first signal line 31 and the second signal line 32 in a direction perpendicular to a main surface of the base substrate 20, so that the first signal line 31 and the second signal line 32 are insulated from each other; similarly, the third signal line 33 is insulated from the first signal line 31 (for example, in a case that the third signal line 33 intersects with the first signal line 31, as shown in FIG. 4a) through an insulating layer; in addition, for example, the base substrate 20 which the touch substrate 100 comprises and the substrate 11 which the pressure sensor 10 comprises is the same substrate.

For example, as shown in FIG. 4a, the first signal lines 31 and the second signal lines 32 intersect with each other to define a plurality of regions arranged in a matrix manner; in each of the regions, the pressure sensor 10 is arranged, the gate electrode 16 of the pressure sensor 10 is electrically connected with the first signal line 31 defining the region, the source electrode 14a of the pressure sensor 10 is electrically connected with the second signal line 32 defining the region, and then the drain electrode 14b of the pressure sensor 10 is connected with the third signal line 33 so as to lead out an output signal of the pressure sensor 10. Of course, the touch substrate provided by the embodiments of the present disclosure comprises, but is not limited to, the structure shown in FIG. 4a.

The embodiments of the present disclosure provide the touch substrate 100 using the pressure sensor 10 provided by any one of the above embodiments as a touch sensor, in the case that a touch object (such as a finger of a user) touches the touch substrate 100, the elastic layer 15 in the pressure sensor 10 to which the touching object applies the pressure deforms, and therefore the current output by the third signal line 33 connected with the pressure sensor 10 changes, and according to the change of the current, the touch position is determined. For example, by applying a scanning signal to the first signal lines 31 one by one, the touch position is determined according to the change of the current of the third signal line 33. Of course, the touch position can be determined in other manners.

For example, in order to simplify arrangement of the signal lines of the touch substrate, as shown in FIG. 4a, the plurality of third signal lines 33 are substantially parallel with the plurality of second signal lines 32. In this case, for example, the third signal lines 33 and the second signal lines 32 are arranged in a same layer, that is to say, the third signal lines 33 and the second signal lines 32 are formed by performing patterning processing on a same thin film. For example, the plurality of third signal lines 33 and the plurality of second signal lines 32 are substantially perpendicular to the first signal lines 31.

In the embodiments of the present disclosure, the elastic layers 15 of the plurality of pressure sensors 10 which the touch substrate comprises are spaced from each other (as shown in FIG. 4a), or are continuously and integrally formed.

Figure 4B:
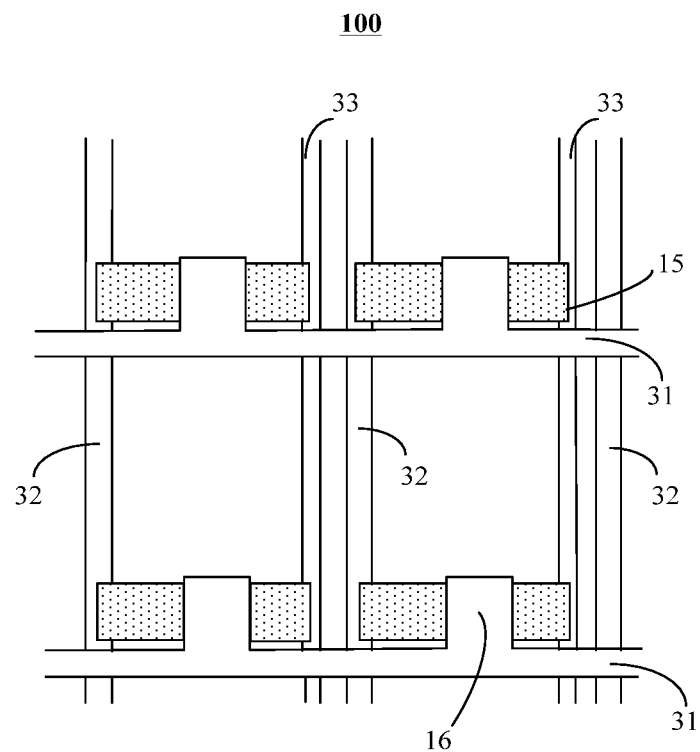

For example, in the direction perpendicular to the base substrate 20, the elastic layer 15 of each pressure sensor 10 overlap with at least one of the second signal line 32 adjacent to the pressure sensor 10 and the third signal line 33 adjacent to the pressure sensor 10. For example, as shown in FIG. 4b, the elastic layer 15 of each pressure sensor overlaps with the adjacent second signal line 32 and the adjacent third signal line 33. Due to the overlapping arrangement, an area of the elastic layer 15 is increased, and therefore it is beneficial to increase an area of the whole pressure sensor.

At least one embodiment of the present disclosure further provides a touch display device, and the touch display device comprises the touch substrate 100 provided by any one of the above embodiments. Hereinafter, explanation is performed in combination with FIGS. 5a to 6c.

Figure 5A:
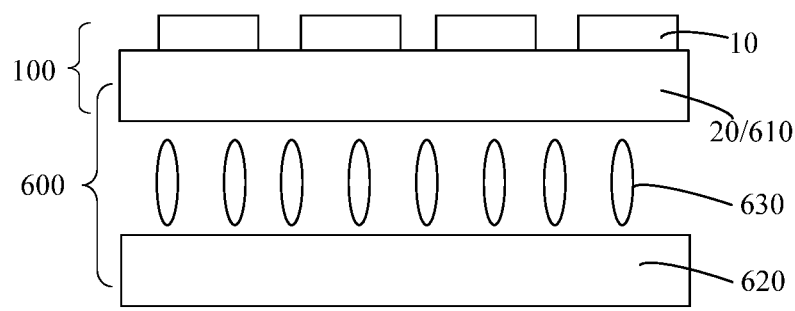
FIGS. 5a and 5b are respectively partial sectional views of a touch display device provided by the embodiments of the present disclosure.

For example, in at least one embodiment of the present disclosure, the touch display device is an on cell touch display device. For example, as shown in FIG. 5a, the touch display device 1000 provided by at least one embodiment of the present disclosure further comprises a display panel 600, the display panel 600 includes a first substrate 610 and a second substrate 620 arranged opposite to each other, the first substrate 610 (compared with the second substrate 620) is closer to a user when the touch display device 1000 works, and the pressure sensor 10 which the touch substrate 100 comprises is arranged on a side of the first substrate 610 away from the second substrate 620. For example, the first substrate 610 and the second substrate 620 are a glass substrate, a quartz substrate, a plastic substrate or a suitable substrate in any type. For example, the first substrate 610 and the base substrate 20 which the touch substrate 100 comprises are the same substrate. For example, the display panel 600 is a liquid crystal panel, and in this case, the display panel 600 further includes a liquid crystal layer 630, as shown in FIG. 5a. Of course, in a case that the on cell touch display device is adopted, the display panel 600 for example is an organic light emitting diode (OLED) display panel or a light emitting diode (LED) display panel or the like.

For example, as for the touch display device 1000 as shown in FIG. 5a, the pressure sensor 10 is covered with a flexible layer (not shown in FIG. 5a), the flexible layer protects the pressure sensor 10, and the flexible layer is bent after bearing the touch, and therefore the elastic layer of the pressure sensor 10 correspondingly deforms. For example, the flexible layer is made from an organic insulating material. For example, the insulating layer 17 which the pressure sensor 10 comprises is the flexible layer.

Figure 5B:
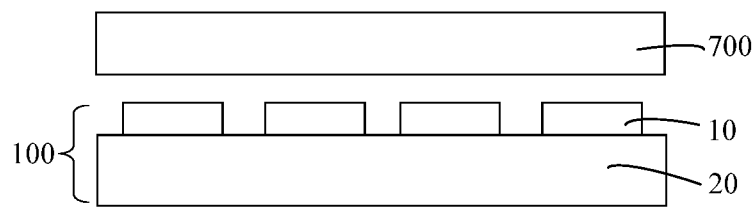

For example, in at least one embodiment of the present disclosure, the touch display device is an in cell touch display device. For example, as shown in FIG. 5b, the touch display device 1000 comprises a flexible substrate 700 arranged opposite to the base substrate 20, the flexible substrate 700, the base substrate 20 and the structure located between the flexible substrate 700 and the base substrate 20 form the display panel, and for example, the display panel is the organic light emitting diode (OLED) display panel or the light emitting diode (LED) display panel or the like; the pressure sensor 10 which the touch substrate 100 comprises is arranged between the base substrate 20 and the flexible substrate 700. The flexible substrate 700 deforms in a case of bearing the touch, and therefore the elastic layer of the pressure sensor 10 correspondingly deforms.

Figure 6A:
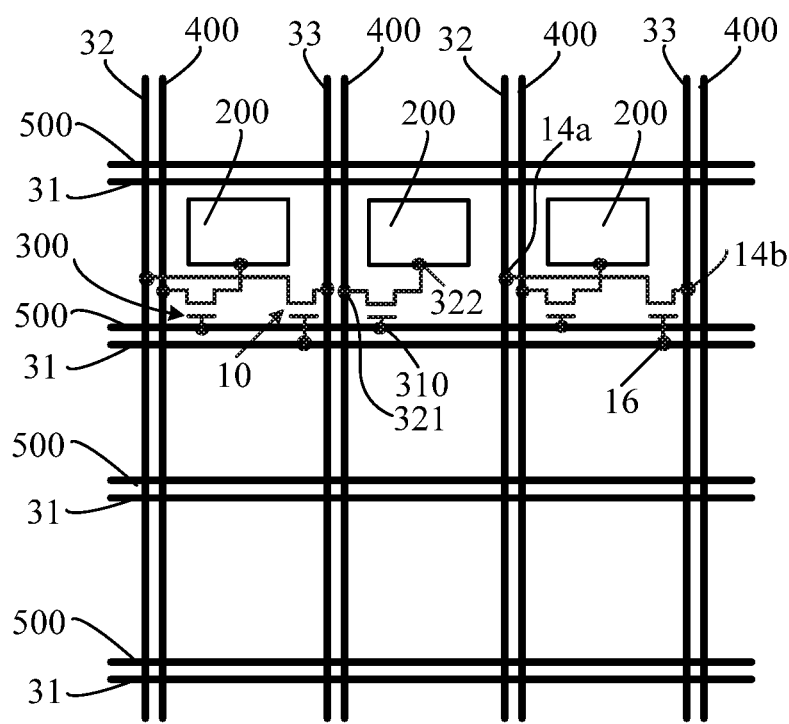
FIGS. 6a to 6c are respectively top views of the touch display device provided by the embodiments of the present disclosure.
Figure 6B:
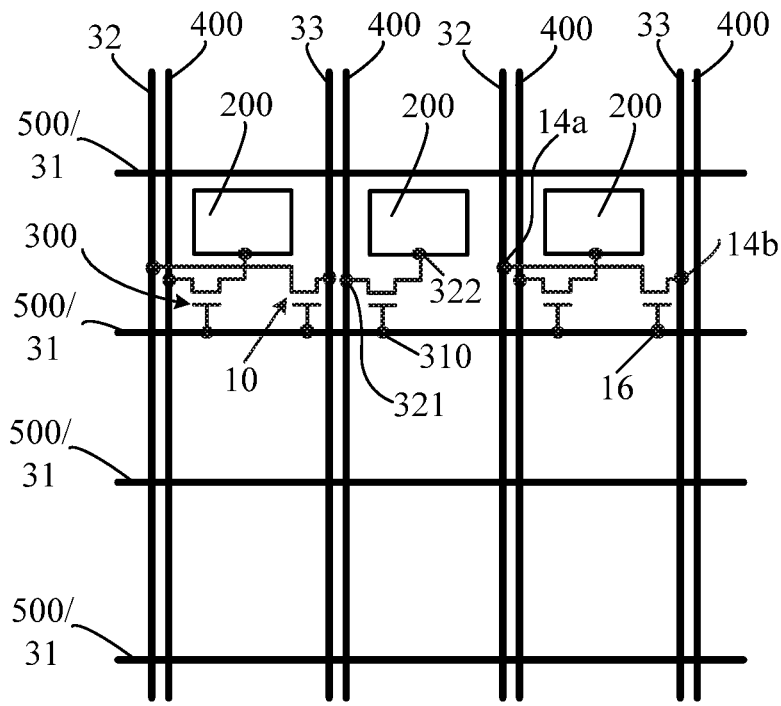
Figure 6C:
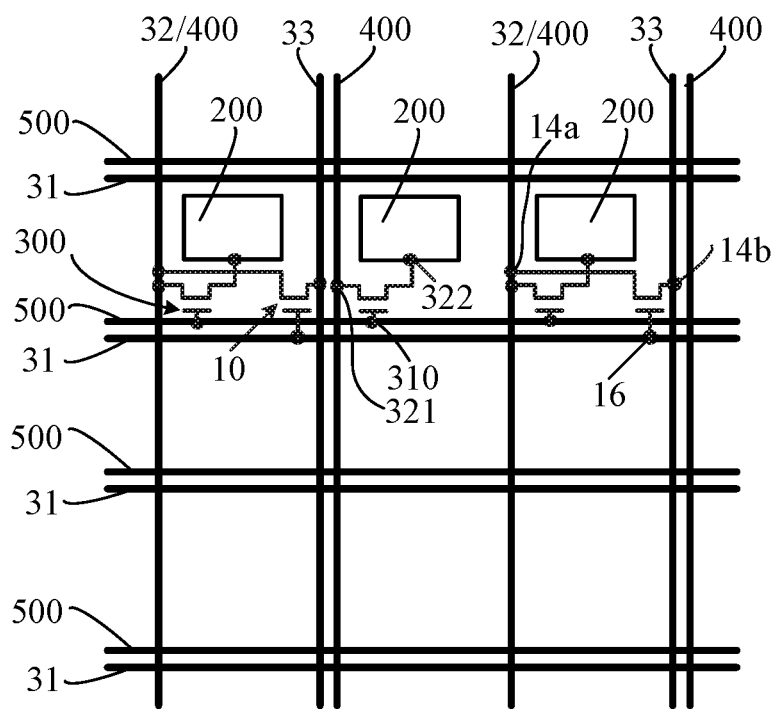

For example, as shown in FIGS. 6a to 6c, the touch display device 1000 provided by at least one embodiment of the present disclosure further comprises a plurality of pixel units 200 and a plurality of transistors 300 located in the display panel (three pixel units 200 and three transistors 300 are shown in FIGS. 6a to 6c). The plurality of pixel units 200 are configured for displaying an image. The plurality of transistors 300 are respectively connected with the plurality of pixel units 200 (as shown in FIGS. 6a to 6c, each transistor 300 is connected with one pixel unit 200) so as to control a display state of the plurality of pixel units 200; each transistor 300 includes a gate electrode 310, a source electrode 321 and a drain electrode 322, and the drain electrode 322 of each transistor 300 is connected with a corresponding pixel unit 200.

For example, each pixel unit 200 includes a light emitting element, such as an OLED element or an LED element or the like, and in this case, for example, the touch display device 1000 is the OLED touch display device or the LED touch display device or a touch display device actively emitting light; for example, each pixel unit 200 further includes a pixel electrode, and in this case, for example, the touch display device 1000 is the touch liquid crystal display device.

For example, as shown in FIGS. 6a to 6c, the touch display device 1000 provided by at least one embodiment of the present disclosure further comprises a plurality of data lines 400 spaced from each other and a plurality of gate lines 500 spaced from each other, for example, at a position where the data line 400 intersects with the gate line 500, an insulating layer is arranged between the data line 400 and the gate line 500, so that the data line 400 is insulated from the gate line 500. The gate electrodes 310 of the plurality of transistors 300 are respectively connected with the gate lines 500 (as shown in drawings, the gate electrode 310 of each transistor 300 is connected with a corresponding gate line 500), and each gate line 500 is configured for providing a gate scanning signal for each row of transistors 300 connected with the gate line 500; the source electrodes 321 of the plurality of transistors 300 are respectively connected with the data lines 400 (as shown in drawings, the source electrode 321 of each transistor 300 is connected with a corresponding data line 400), and each data line 400 is configured for providing a data voltage for each column of transistors 300 connected with the data line 400.

For example, as shown in FIG. 6a, the first signal line 31 connected with the gate electrode 16 of the pressure sensor 10, the second signal line 32 connected with the source electrode 14a of the pressure sensor 10 and the third signal line 33 connected with the drain electrode 14b of the pressure sensor 10 all are insulated from the gate line 500 and the data line 400. Insulation arrangement in the embodiments of the present disclosure refers to insulation between a plurality of structures located in a same layer (for example, between the gate lines, between the data lines and between the same kind of signal lines), and also refers to insulation achieved through an insulating layer at intersection positions of structures located in different layers (for example, between the gate lines and the data lines, and between the signal lines and the gate lines or the data lines). For example, the first signal lines 31 are substantially parallel with the gate lines 500, and for example, the first signal lines 31 and the gate lines 500 are arranged in a same layer; for example, an insulating layer is arranged between a layer where the first signal lines 31 and the gate lines 500 are located and a layer where the data lines 400 are located so as to insulate the first signal lines 31 from the data lines 400. For example, the second signal lines 32 and the third signal lines 33 are both substantially parallel with the data lines 400, for example, the second signal lines 32, the third signal lines 33 and the data lines 400 are arranged in a same layer. Of course, the touch display device provided by the embodiments comprises, but is not limited to, these manners.

By arranging the first signal lines, the second signal lines and the third signal lines insulated from the gate lines and the data lines, a display driving process and a touch driving process of the touch display device 1000 do not interfere with each other, and therefore a display function and a touch function are achieved at the same time or at different times. Besides, the embodiment as shown in FIG. 6a can be used for the on cell touch display device and can also be used for the in cell touch display device.

For example, as shown in FIG. 6b, in a same row, the gate electrode 16 of the pressure sensor 10 and the gate electrode 310 of the transistor 300 are connected with a same gate line 500 (that is to say, the gate electrode 16 of the pressure sensor 10 and the gate electrode 310 of the transistor 300 are connected with a same first signal line 31). In addition, the data lines 400 and the second signal lines 32 are insulated from each other (for example, the data lines 400 and the second signal lines 32 are arranged in a same layer or are respectively arranged in different layers), the source electrodes 321 of the plurality of transistors 300 are respectively connected with the data lines 400, and the gate electrodes 310 of the plurality of transistors 300 are respectively connected with the first signal lines 31. In this way, during the gate scanning signal is applied to each first signal line 31, the pressure sensors 10 and the transistors 300 connected with the first signal line 31 work at the same time, and therefore the touch function and the display function are achieved at the same time.

For example, as shown in FIG. 6c, in a same column, the source electrode 14a of the pressure sensor 10 and the source electrode 321 of the transistor 300 are connected with a same data line 400 (that is to say, the source electrode 14a of the pressure sensor 10 and the source electrode 321 of the transistor 300 are connected with a same second signal line 32). In addition, the gate lines 500 and the first signal lines 31 are insulated from each other (for example, the gate lines 500 and the first signal lines 31 are arranged in a same layer or are respectively arranged in different film layers), the gate electrodes 310 of the plurality of transistors 300 are respectively connected with the gate lines 500, and the source electrodes 321 of the plurality of transistors 300 are respectively connected with the second signal lines 32. In this case, the touch function and the display function are achieved at different times. That is to say, during a display period, the gate line 500 applies the gate scanning signal to the transistor 300 connected with the gate line 500, the data line 400 applies the data voltage to the transistor 300, and the pressure sensor 10 in the pixel where the transistor 300 is located is in a turned-off state (namely in a non-working state); during a touch period, in a same pixel, the transistor 300 is in a turned-off state, the first signal line 31 applies the gate scanning signal to the gate electrode 16 of the pressure sensor 10 connected with the first signal line 31 and the data line 400 applies a source electrode voltage to the pressure sensor 10 connected with the data line 400 so as to make the pressure sensor 10 in a turned-on state, and therefore the output current of the pressure sensor 10 is output through the third signal line 33, and the touch can be determined according to the change of the output current.

The embodiments as shown in FIGS. 6a to 6c all can reduce a number of the signal lines, and all can be used in the in cell touch display device.

In the embodiments of the present disclosure, each pressure sensor 10 corresponds to one pixel unit 200; or, at least one pixel unit is provided between adjacent pressure sensors 10. For example, as shown in FIGS. 6a to 6c, one pixel unit 200 is provided between the adjacent pressure sensors 10.

In case of no conflict, the embodiments of the present disclosure and features in the embodiments can be combined with each other.

The foregoing embodiments merely are exemplary embodiments of the disclosure, and not intended to define the scope of the disclosure, and the scope of the disclosure is determined by the appended claims.

The present application claims priority of Chinese Patent Application No. 201610390259.0 filed on Jun. 3, 2016, the disclosure of which is incorporated herein by reference in its entirety as part of the present application.

The invention claimed is:

1. A pressure sensor, comprising:
a substrate,
an active layer, which is provided on the substrate;
a gate electrode, which is stacked with the active layer and insulated from the active layer;
an elastic layer, which is arranged between the active layer and the gate electrode in a direction perpendicular to the active layer so that the gate electrode is insulated from the active layer; and
a source electrode and a drain electrode, which are spaced from each other and are both electrically connected with the active layer,
wherein if a pressure is applied to the pressure sensor, a thickness of the elastic layer is decreased,
an orthogonal projection of the active layer on the elastic layer is substantially located within the elastic layer,
the active layer is provided on a side of the elastic layer facing the substrate, the gate electrode is provided on a side of the elastic layer facing away from the substrate, and
the elastic layer covers and directly contacts a surface, parallel to the substrate, of the active layer but does not directly contact a side surface, perpendicular to the substrate, of the active layer,
the elastic layer covers and directly contacts surfaces, parallel to the substrate, of the source electrode and the drain electrode and surfaces, perpendicular to the substrate, of the source electrode and the drain electrode, and
the elastic layer further covers and directly contacts a portion of the substrate.

2. The pressure sensor according to claim 1, wherein in the direction perpendicular to the active layer, an interlayer insulating layer is arranged between the elastic layer and at least one of the gate electrode and the active layer.

3. The pressure sensor according to claim 1, wherein at a position where the pressure is applied to the pressure sensor, the thickness of the elastic layer is decreased by at least about 5%.

4. The pressure sensor according to claim 1, wherein the thickness of the elastic layer is about 0.5 micron to 5 microns in a case that the pressure is not applied to the pressure sensor.

5. The pressure sensor according to claim 1, wherein a Young's modulus of the elastic layer is about 0.1 MPa to 10 MPa.

6. The pressure sensor according to claim 1, wherein a material of the elastic layer includes at least one or more of rubber, polyurethane, polypropylene, and polyformaldehyde.

7. The pressure sensor according to claim 1, wherein an orthogonal projection of the gate electrode on the elastic layer is substantially located within the elastic layer.

8. A touch substrate, comprising:
a plurality of pressure sensors according to claim 1;
a plurality of first signal lines spaced from each other, wherein each of the plurality of first signal lines extends in a first direction, and the plurality of first signal lines are electrically connected with gate electrodes of the plurality of pressure sensors respectively;
a plurality of second signal lines spaced from each other, wherein each of the plurality of second signal lines extends in a second direction, the plurality of second signal lines are insulated from the plurality of first signal lines, and the plurality of second signal lines are electrically connected with source electrodes of the plurality of pressure sensors respectively; and
a plurality of third signal lines spaced from each other, wherein each of the plurality of third signal lines extends in the second direction, the plurality of third signal lines are insulated from the first signal lines and the second signal lines, and the plurality of third signal lines are electrically connected with drain electrodes of the plurality of pressure sensors respectively,
wherein one second signal line extending in the second direction and one third signal line extending in the second direction, which are spaced from each other in the first direction, are provided between two pressure sensors immediately adjacent to each other in the first direction, and the second direction intersects with the first direction, and
in the first direction, a distance between the one second signal line extending in the second direction and the one third signal line extending in the second direction is smaller than a distance between another one second signal line and another one third signal line, and the another one second signal line and the another one third signal line are directly connected with a same pressure sensor among the plurality of pressure sensors.

9. The touch substrate according to claim 8, wherein the plurality of third signal lines are parallel with the plurality of second signal lines.

10. The touch substrate according to claim 8, wherein
in a direction perpendicular to the touch substrate, the elastic layer of each pressure sensor overlaps with the second signal line connected with the pressure sensor and the third signal line connected with the pressure sensor,
the source electrode and the drain electrode of each pressure sensor is provided between an inner edge of the second signal line connected with the pressure sensor and an inner edge of the third signal line connected with the pressure sensor, and a distance between an end of the elastic layer facing away from the second signal line and an end of the elastic layer facing away from the third signal line is larger than a distance between the inner edge of the second signal line connected with the pressure sensor and the inner edge of the third signal line connected with the pressure sensor.

11. A touch display device, comprising the touch substrate according to claim 8, wherein the touch display device further comprises a plurality of pixel units and a plurality of transistors, and the plurality of transistors are respectively connected with the plurality of pixel units.

12. The touch display device according to claim 11, further comprising:
a plurality of data lines spaced from each other, wherein each of the plurality of data lines extends in the second direction, and the plurality of data lines are insulated from the first signal lines, the second signal lines and the third signal lines, wherein source electrodes of the plurality of transistors are respectively connected with the data lines, and gate electrodes of the plurality of transistors are respectively connected with the first signal lines.

13. The touch display device according to claim 11, further comprising:

a plurality of gate lines spaced from each other, wherein each of the plurality of gate lines extends in the first direction, and the plurality of gate lines are insulated from the first signal lines, the second signal lines and the third signal lines, wherein gate electrodes of the plurality of transistors are respectively connected with the gate lines, and source electrodes of the plurality of transistors are respectively connected with the second signal lines.

14. The touch display device according to claim 11, further comprising: a plurality of data lines spaced from each other and a plurality of gate lines spaced from each other, wherein each of the plurality of data lines extends in the second direction, each of the plurality of gate lines extends in the first direction, the plurality of data lines and the plurality of gate lines are insulated from the first signal lines, the second signal lines and the third signal lines, gate electrodes of the plurality of transistors are respectively connected with the gate lines, and source electrodes of the plurality of transistors are respectively connected with the data lines.

15. The touch display device according to claim 11, further comprising: a flexible substrate arranged opposite to the touch substrate, wherein the pressure sensors which the touch substrate comprises are arranged between the substrate and the flexible substrate.

16. The touch display device according to the claim 11, further comprising a display panel, wherein, the display panel includes a first substrate and a second substrate which are arranged opposite to each other, and the pressure sensors which the touch substrate comprises are arranged on a side of the first substrate away from the second substrate.

17. The touch substrate according to claim 8, wherein, each of the plurality of pressure sensors comprises the elastic layer, and the elastic layers of the plurality of pressure sensors are spaced from each other, or are continuously and integrally formed.

18. The touch substrate according to claim 8, wherein in the first direction, a width of one of the plurality of second signal lines is larger than a width of one of the plurality of third signal lines.

* * * * *